United States Patent [19]

Bessho et al.

[11] Patent Number: 5,651,179
[45] Date of Patent: Jul. 29, 1997

[54] METHOD FOR MOUNTING A SEMICONDUCTOR DEVICE ON A CIRCUIT BOARD

[75] Inventors: Yoshihiro Bessho, Higashiosaka; Yoshihiro Tomura, Hirakata, both of Japan

[73] Assignee: Matsushita Electric Industrial Co., Ltd., Osaka, Japan

[21] Appl. No.: 731,521

[22] Filed: Oct. 15, 1996

Related U.S. Application Data

[60] Continuation of Ser. No. 368,044, Jan. 3, 1995, abandoned, which is a division of Ser. No. 315,084, Sep. 29, 1994, abandoned.

[30] Foreign Application Priority Data

| Sep. 29, 1993 | [JP] | Japan | 5-242645 |
| Sep. 29, 1993 | [JP] | Japan | 5-242646 |
| Sep. 29, 1993 | [JP] | Japan | 5-242647 |

[51] Int. Cl.$^6$ .................................................. H05K 3/30
[52] U.S. Cl. ........................ 29/832; 29/830; 29/846
[58] Field of Search ........................ 29/832, 825, 830, 29/846, 890; 437/183

[56] References Cited

U.S. PATENT DOCUMENTS

| 3,795,047 | 3/1974 | Abolafia et al. | 29/830 X |
| 4,157,932 | 6/1979 | Hirata | 29/830 X |
| 4,814,040 | 3/1989 | Ozawa | 29/846 X |
| 4,917,466 | 4/1990 | Nakamura et al. | |
| 5,121,190 | 6/1992 | Hsiao et al. | |
| 5,318,651 | 6/1994 | Matsui et al. | 29/830 X |
| 5,384,952 | 1/1995 | Matsui | 29/830 |
| 5,412,867 | 5/1995 | Aikawa et al. | 29/825 |

FOREIGN PATENT DOCUMENTS

| 0332402 | 9/1989 | European Pat. Off. . | |
| 0469614 | 2/1992 | European Pat. Off. . | |
| 64-72547 | 3/1989 | Japan . | |
| 5218137 | 8/1993 | Japan . | |
| 2014791 | 8/1979 | United Kingdom | 29/846 |
| 88/03704 | 5/1988 | WIPO . | |

OTHER PUBLICATIONS

European Search Report dated Feb. 27, 1995.

*Primary Examiner*—Carl J. Arbes
*Attorney, Agent, or Firm*—Ratner & Prestia

[57] ABSTRACT

A method for mounting a semiconductor device on a circuit board which includes the steps of: joining a terminal electrode of the semiconductor device to a connecting electrode of the circuit board by means of a thermoplastic conductive adhesive; allowing a thermosetting resin to fill a gap between the semiconductor device and the circuit board; and curing the thermosetting resin at a temperature equal to or higher than the plasticizing temperature of the thermoplastic conductive adhesive is disclosed.

10 Claims, 3 Drawing Sheets

METHOD FOR MOUNTING A SEMICONDUCTOR DEVICE ON A CIRCUIT BOARD

This application is a continuation of U.S. patent application Ser. No. 08/368,044 filed Jan. 3, 1995, abandoned, which is a division of U.S. patent application Ser. No. 08/315,084, filed Sep. 29, 1994, now abandoned.

BACKGROUND OF THE INVENTION

1. Field of the Invention

The present invention relates to a method for mounting a semiconductor device on a circuit board, and also relates to the circuit board with the semiconductor device mounted thereon. More particularly, the invention relates to a method for mounting a semiconductor device facedown on a circuit board by the use of a conductive adhesive, and also relates to the circuit board on which the semiconductor device is mounted by using this method.

2. Description of the Related Art

Previously, soldering technology has often been used to mount a semiconductor device on a circuit board. In recent years, the package of a semiconductor device has become smaller in size and the number of the pins thereof has increased, so that the pin pitch has been greatly reduced. It is difficult to mount a semiconductor device with such a reduced pin pitch on a circuit board by using the conventional soldering technology. In the present specification, a circuit board can include a chip carrier or the like.

Thus, there has recently been developed a method in which a semiconductor device without a package, a so called bare chip, is directly mounted on a circuit board, thereby reducing the mounting area and increasing the board density. An example of such a method is as follows: First, an electrode composed of a solder layer is formed on each terminal electrode of the semiconductor device. Then, the semiconductor device is placed facedown on a circuit board so that the thus formed electrode comes into contact with a corresponding connecting electrode of the circuit board. Thereafter, the solder is heated to melt, thereby bonding the semiconductor device to the circuit board. This mounting method is advantageous in that all the terminal electrodes of the semiconductor device can be simultaneously connected to the circuit board. In a mounting method disclosed in U.S. Pat. No. 5,121,190, such a solder joint between a semiconductor device and a circuit board is sealed with a resin so as to ensure the stability of the joint.

The inventors have found that the above conventional method of mounting a semiconductor device involves the following problems:

(1) While a liquid sealing resin filled between the semiconductor device and the circuit board is being heated to be cured, thermal stress is induced by the difference in coefficients of thermal expansion between the semiconductor device and the circuit board, and is accordingly applied to the solder joint. Since solder is rigid and lacks flexibility, the solder joint can easily break due to the thermal stress applied thereto.

(2) When the semiconductor device mounted on the circuit board operates at high temperatures, the solder joint is subjected not only to a thermal stress induced by the difference in coefficients of thermal expansion between the semiconductor device and the circuit board, but also to a thermal stress induced by the thermal expansion of the sealing resin filled between the semiconductor device and the circuit board. These thermal stresses may cause the solder joint to break.

Therefore, the conventional mounting method is disadvantageous in that a reliable connection between a semiconductor device and a circuit board cannot be obtained.

SUMMARY OF THE INVENTION

The method for mounting a semiconductor device on a circuit board of the present invention, includes the steps of:
- joining a terminal electrode of the semiconductor device to a connecting electrode of the circuit board by means of a thermoplastic conductive adhesive;
- allowing a thermosetting resin to fill a gap between the semiconductor device and the circuit board; and
- curing the thermosetting resin at a temperature equal to or higher than a plasticizing temperature of the thermoplastic conductive adhesive.

In one embodiment of the present invention, the above-mentioned method further includes the step of forming a bump electrode on the terminal electrode of the semiconductor device, the step being performed prior to the joining step.

In another aspect of the present invention, a circuit board with a semiconductor device mounted thereon is provided. The circuit board includes:
- a joining layer formed of a thermoplastic conductive adhesive between a terminal electrode of the semiconductor device and a connecting electrode of the circuit board; and
- a resin layer formed of a thermosetting resin between the semiconductor device and the circuit board.

In one embodiment of the present invention, the above-mentioned circuit board further includes a bump electrode on the terminal electrode of the semiconductor device.

In another embodiment of the present invention, the thermoplastic conductive adhesive contains a thermoplastic resin and a conductive filler.

In still another embodiment of the present invention, the thermosetting resin has a glass transition point equal to or higher than the maximum operating temperature for the semiconductor device.

In still another embodiment of the present invention, the plasticizing temperature of the thermoplastic conductive adhesive is equal to or higher than the maximum operating temperature for the semiconductor device.

In still another embodiment of the present invention, the temperature at which the thermosetting resin is cured is equal to or higher than the maximum operating temperature for the semiconductor device.

Thus, the invention described herein makes possible the advantages of (1) providing a highly reliable circuit board with a semiconductor device mounted thereon, and (2) providing a method for mounting a semiconductor device on a circuit board with high reliability.

These and other advantages of the present invention will become apparent to those skilled in the art upon reading and understanding the following detailed description with reference to the accompanying figures.

DESCRIPTION OF THE PREFERRED EMBODIMENTS

An embodiment of the present invention will now be described with reference to FIGS. 1A to 1D.

Figure 1A:
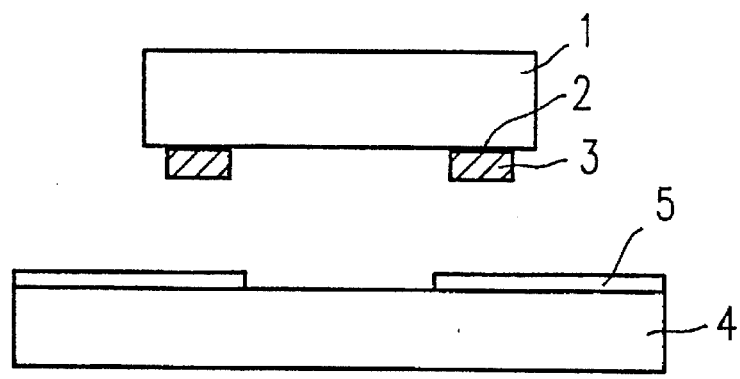
FIGS. 1A to 1D are diagrams showing the process of mounting a semiconductor device on a circuit board according to a method of the present invention.

As shown in FIG. 1A, on each terminal electrode 2 of a semiconductor device 1, a conductive adhesive layer 3 is formed using a thermoplastic conductive adhesive. Then, with the conductive adhesive layers 3 of the semiconductor device 1 aligned with corresponding connecting electrodes 5 of a circuit board 4, the semiconductor device 1 is placed facedown (with its terminal electrodes 2 facing downward) on the circuit board 4.

Figure 1B:
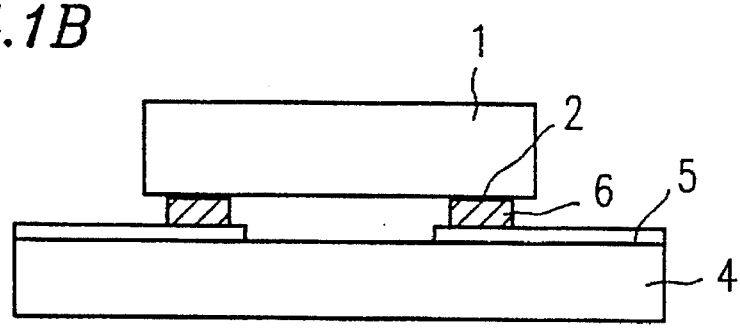

Thereafter, the thermoplastic conductive adhesive constituting the conductive adhesive layers 3 is heated at a temperature equal to or higher than its plasticizing temperature (e.g. 125° C.), thereby improving the adhesion of the conductive adhesive layers 3 to the terminal electrodes 2 and to the connecting electrodes 5. The thermoplastic conductive adhesive is then cooled to a temperature lower than the plasticizing temperature, e.g., it is cooled to room temperature (25° C.), resulting in joining layers 6 as shown in FIG 1B. In this manner, the terminal electrodes 2 of the semiconductor device 1 are electrically connected to and mechanically fixed to the corresponding connecting electrodes 5 of the circuit board 4 by means of the joining layers 6 formed of the thermoplastic conductive adhesive.

Figure 1C:
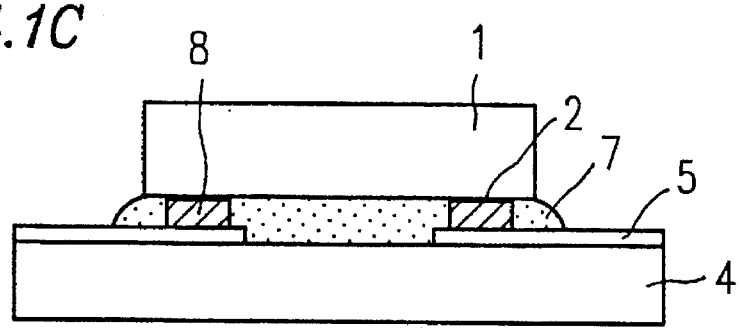

Next, as shown in FIG. 1C, the gap between the semiconductor device 1 and the circuit board 4 is filled with a liquid thermosetting resin 7 (e.g. an epoxy resin). The liquid thermosetting resin 7 is then cured at a temperature equal to or higher than the plasticizing temperature of the thermoplastic conductive adhesive used for the conductive adhesive layers 3 (e.g., it is cured at 150° C.).

While the thermosetting resin 7 is being cured, the thermoplastic conductive adhesive constituting the joining layers 6 is plasticized again. FIG. 1C diagrammatically illustrates the curing of the thermosetting resin 7, where the reference numeral 8 denotes the joining layers composed of the thus plasticized thermoplastic conductive adhesive. As the curing reaction proceeds, the liquid thermosetting resin 7 is cured and shrinks, thereby forming a cured resin layer 9. At this time, the compression force of the cured resin layer 9 is applied to the plasticized joining layers 8, so that the adhesion of the joining layers 8 to the semiconductor device 1 and to the circuit board 4 is improved, thereby improving the stability of the connection between the semiconductor device 1 and the circuit board 4. The liquid thermosetting resin 7 used herein is a thermosetting resin which is cured at temperatures equal to or higher than the plasticizing temperature of the thermoplastic conductive adhesive used for the conductive adhesive layer 3.

Figure 1D:
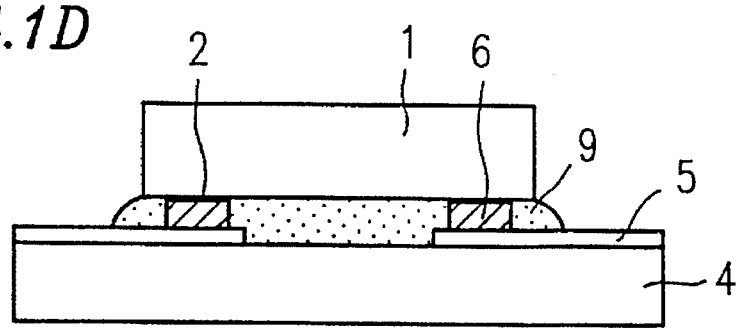

After the thermosetting resin has been cured, it is cooled to a temperature lower than the plasticizing temperature of the thermoplastic conductive adhesive, thereby allowing the plasticized joining layers 8 to solidify and turn into the joining layers 6 again. As a result, the circuit board 4 with the semiconductor device 1 mounted thereon is obtained as shown in FIG. 1D, in which the semiconductor device 1 is electrically connected to the circuit board 4 by the joining layers 6 of the thermoplastic conductive adhesive, and the gap between the semiconductor device 1 and the circuit board 4 is filled with the cured resin layer 9.

In the thus obtained circuit board with the semiconductor device mounted thereon, the semiconductor device 1 is joined to the circuit board 4 by means of the joining layers 6 made of the thermoplastic conductive adhesive, and the gap between the semiconductor device 1 and the circuit board 4 is filled with the resin layer 9 made of the thermosetting resin. Accordingly, the joining layers 6 of the thermoplastic conductive adhesive, which serve as the joint between the semiconductor device 1 and the circuit board 4, are not substantially affected by the thermal stress induced by the difference in coefficients of thermal expansion between the semiconductor device 1 and the circuit board 4. Therefore, the present invention can provide a highly reliable circuit board with a semiconductor device mounted thereon.

In the method for mounting a semiconductor device on a circuit board according to the present invention, a thermoplastic conductive adhesive is used to join the semiconductor device to the circuit board, after which a liquid thermosetting resin filled between the semiconductor device and the circuit board is cured at a temperature equal to or higher than the plasticizing temperature of the thermoplastic conductive adhesive. This means that the thermoplastic conductive adhesive joint between the semiconductor device and the circuit board softens (i.e., it is plasticized) and is accordingly kept flexible during the curing of the thermosetting resin. Therefore, the internal distortion, which would arise in the joint by the shrinkage of the thermosetting resin during the curing thereof, is reduced. This makes it possible to ensure the stability of the electrical and mechanical connection between the semiconductor device and the circuit board.

Preferably, the sealing resin is cured at a temperature equal to or higher than the maximum operating temperature. This allows the compression force of the sealing resin to be applied to the joint between the semiconductor device and the circuit board over the operating temperature range for the semiconductor device. Thus, the connection between the semiconductor device and the circuit board can be kept stable over the operating temperature range for the semiconductor device. Therefore, the present invention can provide a highly reliable circuit board with a semiconductor device mounted thereon.

Preferably, a sealing resin having a glass transition point equal to or higher than the maximum operating temperature for the semiconductor device is used as the thermosetting resin. This allows the semiconductor device to operate at temperatures equal to or lower than the glass transition point of the sealing resin filled between the semiconductor device and the circuit board, so that the coefficient of thermal expansion of the sealing resin is small. Thus, the connection between the semiconductor device and the circuit board can be kept stable over the operating temperature range for the semiconductor device. This makes it possible to provide a highly reliable circuit board with a semiconductor device mounted thereon.

Preferably, the plasticizing temperature of the thermoplastic conductive adhesive is equal to or higher than the operating temperature of the semiconductor device. This is because the thermoplastic conductive adhesive has a higher strength at a temperature lower than the plasticizing temperature than at the temperature equal to or higher than the plasticizing temperature. Even at a temperature lower than the plasticiztng temperature of the thermoplastic conductive adhesive, the thermoplastic conductive adhesive is more flexible than solder. Therefore, the thermoplastic conductive adhesive layer of the present invention has a higher stress resistance than the solder used in conventional mounting technology.

Generally, the operating temperature of the semiconductor device is in the range of −45° C. to 125° C. The plasticizing temperature of the thermoplastic conductive adhesive is preferably equal to or lower than 150° C. More preferable, as mentioned above, the plasticizing temperature of the thermoplastic conductive adhesive is equal to or higher than 125° C., which is the maximum operating temperature for the semiconductor device. The curing temperature of the thermosetting resin is preferably higher than 150° C. so that the stress caused by the shrinkage of the thermosetting resin during the curing functions as a compression stress for the joining layer over the operating temperature range for the semiconductor device. The glass transition point is preferably equal to or higher than 125° C., more preferably higher than 150° C. so as to keep a low thermal expansion coefficient and a high mechanical strength over the operating temperature range for the semiconductor device.

Figure 2:
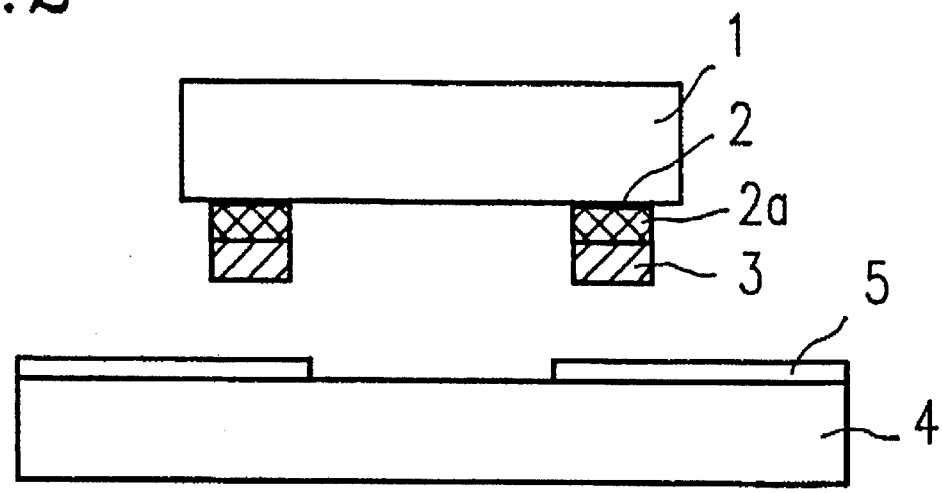
FIG. 2 is a diagram showing an example of the step of forming an adhesive layer 3 according to the method of the present invention.

In the above-described embodiment, the adhesive layers 3 of the thermoplastic conductive adhesive are directly formed on the terminal electrodes 2 of the semiconductor device 1. According to the present invention, however, the adhesive layers 3 can also be formed as follows: As shown in FIG. 2, a bump electrode 2a is formed on each terminal electrode 2, after which an adhesive layer 3 is formed on each of the thus formed bump electrodes 2a. The height of the bump electrodes 2a is preferably set such that the distance of the gap between the semiconductor device 1 and the circuit board 4 is in the range of 20 µm to 100 µm. If the gap is smaller than 20 µm, it is difficult to fill the gap with sealing resin. If the gap is larger than 100 µm, it is difficult to form the bump electrodes 2a.

Figure 3:
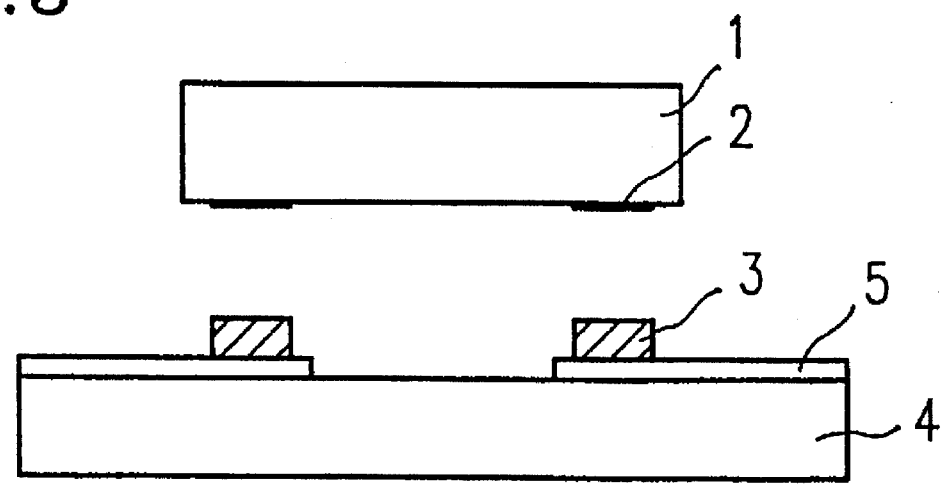
FIG. 3 is a diagram showing another example of the step of forming an adhesive layer 3 according to the method of the present invention.

Alternatively, as shown in FIG. 3, adhesive layers 3 can be formed directly on the connecting electrodes 5 of the circuit board 4. In either case, after the adhesive layers 3 are formed (as shown in FIG. 2 or 3), the same steps as those of the above-described embodiment shown in FIGS. 1B to 1D are performed, so that a highly reliable circuit board with a semiconductor device mounted thereon can be obtained.

Figure 4:
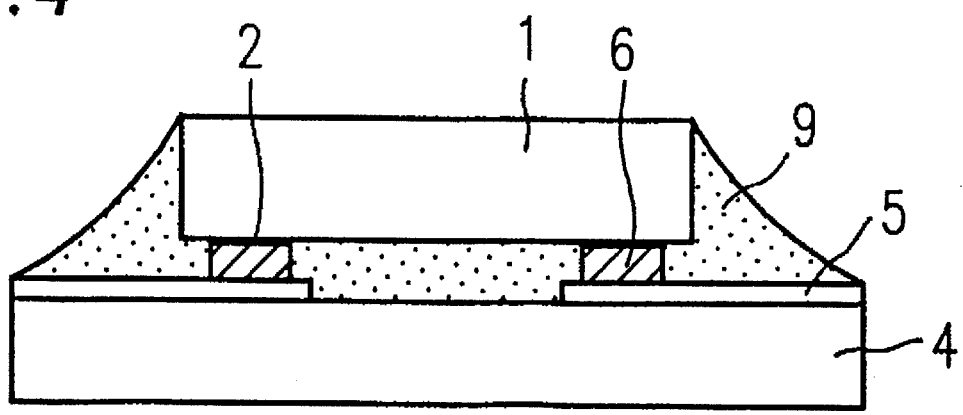
FIG. 4 is a diagram showing an example of the circuit board with a semiconductor device mounted thereon according to the present invention.

In the above-described embodiment, the cured resin layer 9 is formed only in a gap between the semiconductor device 1 and the circuit board 4. However, the present invention is not limited to this construction, the resin layer 9 may cover the peripheral portions of the semiconductor device 1 also, as shown in FIG. 4.

The thermoplastic conductive adhesive used in the present invention can be any thermoplastic conductive adhesive made of a thermoplastic resin such as a polyester resin containing a conductive filler such as Ag or the like. It can further contain an organic solvent.

The thermosetting resin used in the present invention can be any insulating resin, such as an epoxy resin, a silicone resin, a polyimide resin or a phenol resin, curable at temperatures equal to or higher than the plasticizing temperature of the thermoplastic conductive adhesive. Furthermore, an inorganic filler such as silica can be added to the thermosetting resin, thereby reducing its coefficient of thermal expansion. Using this thermosetting resin with a reduced coefficient of thermal expansion, the reliability of the connection between the semiconductor device and the circuit board can be further increased.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A method for mounting a semiconductor device on a circuit board, comprising the steps of:

joining a terminal electrode of the semiconductor device to a connecting electrode of the circuit board by means of a thermoplastic conductive adhesive;

allowing a thermosetting resin to fill a gap between the semiconductor device and the circuit board; and curing the thermosetting resin at a temperature equal to or higher than a plasticizing temperature of the thermoplastic conductive adhesive.

2. A method according to claim 1, further comprising the step of forming a bump electrode on the terminal electrode of the semiconductor device, the step being performed prior to the joining step.

3. A method according to claim 1, wherein the thermoplastic conductive adhesive contains a thermoplastic resin and a conductive filler.

4. A method according to claim 1, wherein the thermosetting resin has a glass transition point equal to or higher than the maximum operating temperature for the semiconductor device.

5. A method according to claim 1, wherein the plasticizing temperature of the thermoplastic conductive-adhesive is equal to or higher than the maximum operating temperature for the semiconductor device.

6. A method according to claim 1, wherein the temperature at which the thermosetting resin is cured is equal to or higher than the maximum operating temperature for the semiconductor device.

7. A method according to claim 1, wherein the thermoplastic conductive adhesive has a plasticizing temperature equal to or higher than 125° C.

8. A method according to claim 1, wherein the thermosetting resin is cured at about 150° C.

9. A method according to claim 8, wherein the plasticizing temperature of the thermoplastic conductive adhesive is less than about 150° C.

10. A method according to claim 8, wherein the plasticizing temperature of the thermoplastic conductive adhesive is equal to or less than about 130° C.

* * * * *